(12) United States Patent
Lee et al.

(10) Patent No.: US 9,727,611 B2
(45) Date of Patent: Aug. 8, 2017

(54) HYBRID BUFFER MANAGEMENT SCHEME FOR IMMUTABLE PAGES

(71) Applicant: Samsung Electronics Co., Ltd., Gyeonggi-do (KR)

(72) Inventors: Sang Won Lee, Menlo Park, CA (US); Yang Seok Ki, Palo Alto, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 456 days.

(21) Appl. No.: 14/281,453

(22) Filed: May 19, 2014

(65) Prior Publication Data

US 2015/0134709 A1    May 14, 2015

Related U.S. Application Data

(60) Provisional application No. 61/902,026, filed on Nov. 8, 2013.

(51) Int. Cl.

| | | |
|---|---|---|
| *G06F 17/30* | (2006.01) | |
| *G06F 12/0804* | (2016.01) | |
| *H05K 5/03* | (2006.01) | |
| *H05K 5/04* | (2006.01) | |
| *H05K 5/06* | (2006.01) | |
| *H05K 7/20* | (2006.01) | |

(52) U.S. Cl.
CPC ...... *G06F 17/3048* (2013.01); *G06F 12/0804* (2013.01); *H05K 5/03* (2013.01); *H05K 5/04* (2013.01); *H05K 5/069* (2013.01); *H05K 7/20536* (2013.01)

(58) Field of Classification Search
CPC ... G06F 12/0804; G06F 17/3048; H05K 5/03; H05K 5/04; H05K 5/069; H05K 7/20536
USPC .................................................. 707/741, 812
See application file for complete search history.

(56) References Cited

U.S. PATENT DOCUMENTS

| | | | |
|---|---|---|---|
| 5,043,866 A * | 8/1991 | Myre, Jr. ............ | G06F 11/1471 714/E11.13 |
| 7,328,324 B2 | 2/2008 | Wang | |
| 7,856,530 B1 | 12/2010 | Mu | |
| 9,026,737 B1 * | 5/2015 | Armangau .......... | G06F 12/0822 711/118 |
| 9,032,017 B1 * | 5/2015 | Singh ................ | G06F 17/30194 709/203 |
| 2003/0233493 A1 * | 12/2003 | Boldon ..................... | G06F 8/60 710/1 |

(Continued)

OTHER PUBLICATIONS

Martin, P., et al., "Automated Configuration of Multiple Buffer Tools," Oxford University Press, British Computer Society, 2006.

*Primary Examiner* — Phong Nguyen
(74) *Attorney, Agent, or Firm* — Convergent Law Group LLP

(57) ABSTRACT

Exemplary embodiments provide a hybrid buffer pool for a database that includes a plurality of data pages contained in storage. The hybrid buffer pool comprises: a shared buffer pool of page frames containing dirty data pages that are modified after reading that will be written back to storage; an immutable buffer pool that temporarily contains read-only data pages from the storage; and a page multiplexer that identifies which ones of the data pages from storage to store in the immutable buffer pool based at least in part on information from a query processor.

20 Claims, 5 Drawing Sheets

(56) References Cited

U.S. PATENT DOCUMENTS

| | | | |
|---|---|---|---|
| 2006/0176161 A1* | 8/2006 | Bonitz | B60R 21/013 340/436 |
| 2008/0320353 A1* | 12/2008 | Blankenship | H04L 1/0068 714/746 |
| 2009/0037941 A1* | 2/2009 | Armstrong | G06F 12/1475 719/328 |
| 2012/0089791 A1* | 4/2012 | Oberhofer | G06F 17/30339 711/154 |
| 2012/0131309 A1* | 5/2012 | Johnson | G06F 9/30 712/41 |
| 2013/0124794 A1 | 5/2013 | Bux | |
| 2014/0006686 A1* | 1/2014 | Chen | G06F 3/0611 711/102 |
| 2015/0058567 A1* | 2/2015 | Hechtman | G06F 12/0811 711/122 |

\* cited by examiner

Conditions For Immutable Buffer Pool Storage
300

1) Data page in the long tail that has no spatial or temporal locality;

2) Data page results from read queries with weak consistency.

3) Data page that is accessed through a table index for a point or range query.

FIG. 3

HYBRID BUFFER MANAGEMENT SCHEME FOR IMMUTABLE PAGES

CROSS-REFERENCE TO RELATED APPLICATIONS

This application claims the benefit of U.S. Provisional Patent Application No. 61/902,026, filed Nov. 8, 2013, as is incorporated herein by reference.

BACKGROUND

Most database systems preallocate memory space and manage for buffering and caching data pages from storage. Modern database buffers and file system caches include a pool of page frames which can consume several gigabytes of memory space. This memory space is used to stage data from storage for query processing and to provide fast accesses to data. For best performance, these page frames are typically managed by a buffer replacement algorithm such as least recently used (LRU) scheme in order to keep data most likely to be accessed in the future in the memory. In real environments, numerous processes contend for these page frames, and the buffer replacement algorithm should be designed sophisticatedly. However, the exemplary embodiments observe that database systems often cannot saturate the storage device (i.e., SSD) regardless of client scale. An in-depth performance analysis of database systems reveal that page-reads are often delayed by preceding page-writes when there is high concurrency among reads and writes. This "read blocked by write" problem can negatively impact CPU utilization.

BRIEF SUMMARY

Exemplary embodiments provide a hybrid buffer pool for a database that includes a plurality of data pages contained in storage. The hybrid buffer pool comprises: a shared buffer pool of page frames containing dirty data pages that are modified after reading that will be written back to storage; an immutable buffer pool that temporarily contains read-only data pages from the storage; and a page multiplexer that identifies which ones of the data pages from storage to store in the immutable buffer pool based at least in part on information from a query processor.

BRIEF DESCRIPTION OF SEVERAL VIEWS OF THE DRAWINGS

These and/or other features and utilities of the present general inventive concept will become apparent and more readily appreciated from the following description of the embodiments, taken in conjunction with the accompanying drawings of which:

FIG. 3 is a table illustrating conditions that must be satisfied in order for the page multiplexer to identify data pages that can be stored in the immutable buffer pool.

DETAILED DESCRIPTION

Figure 1:
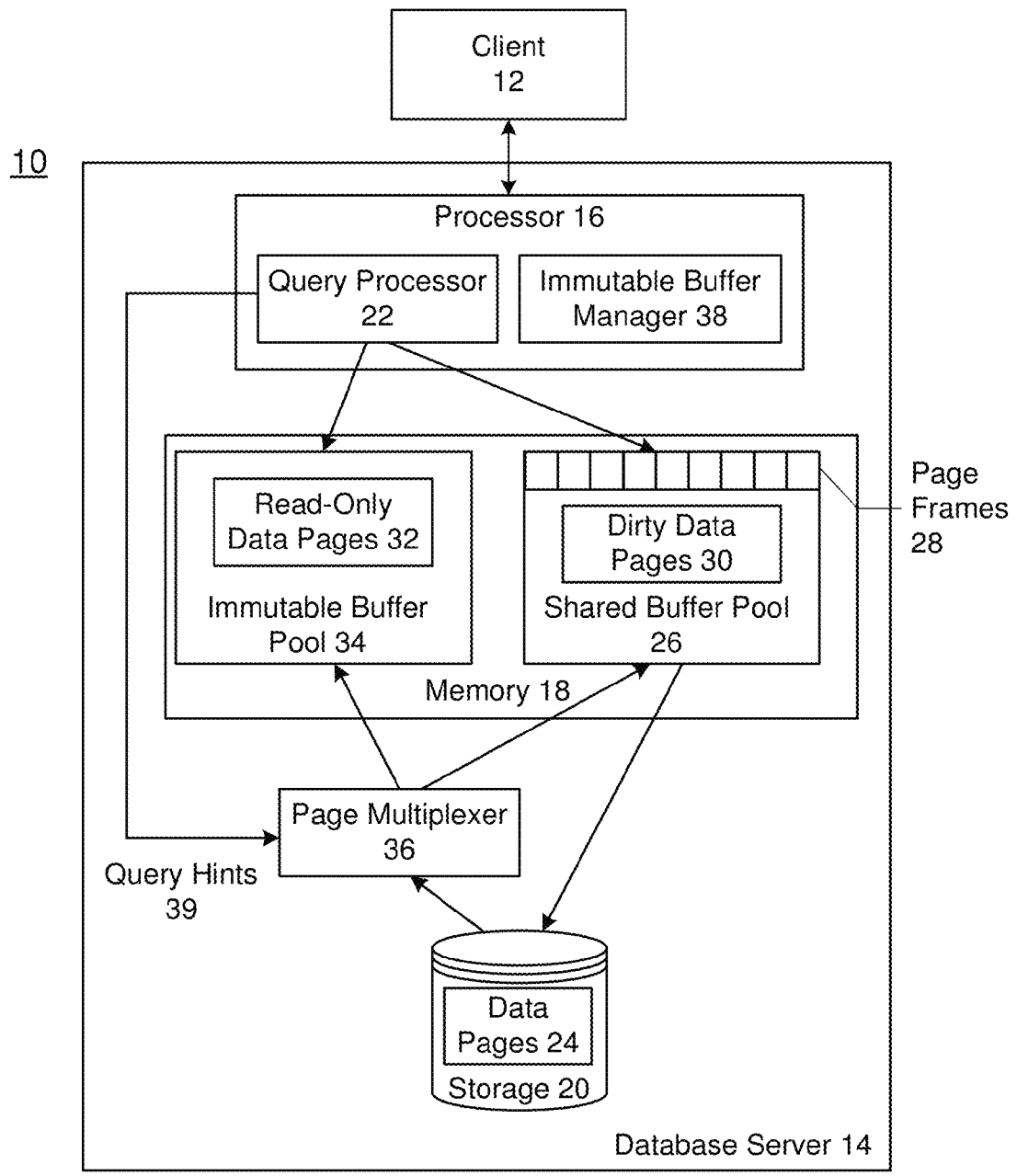
FIG. 1 is a block diagram illustrating a database query processing system having a hybrid buffer pool having a shared buffer pool and an immutable buffer pool in accordance with the exemplary embodiments.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

Advantages and features of the present invention and methods of accomplishing the same may be understood more readily by reference to the following detailed description of embodiments and the accompanying drawings. The present general inventive concept may, however, be embodied in many different forms and should not be construed as being limited to the embodiments set forth herein. Rather, these embodiments are provided so that this disclosure will be thorough and complete and will fully convey the concept of the general inventive concept to those skilled in the art, and the present general inventive concept will only be defined by the appended claims. In the drawings, the thickness of layers and regions are exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

The term "component" or "module", as used herein, means, but is not limited to, a software or hardware component, such as a field programmable gate array (FPGA) or an application specific integrated circuit (ASIC), which performs certain tasks. A component or module may advantageously be configured to reside in the addressable storage medium and configured to execute on one or more processors. Thus, a component or module may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for the components and components or modules may be combined into fewer components and components or modules or further separated into additional components and components or modules.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

This invention proposes a hybrid buffer management scheme to solve the "read blocked by write" problem, so that database systems can not only improve the CPU utilization in terms of cache hit ratio and effective cycles but also fully leverage storage performance potentials.

FIG. 1 is a block diagram illustrating a database query processing system 10 having a hybrid buffer pool having a shared buffer pool and an immutable buffer pool in accordance with the exemplary embodiments. The database query processing system 10 may include the client computer 12 in communication with the database server 14 over a network (not shown). The database server 14 may include typical computer components including a processor 16, a memory 18, and high-speed storage 20 (e.g., solid state drive (SSD)).

In operation, a user or an application on the client computer 12 may issue queries, e.g., a SQL command, to the database server 14. A query processor 22 executing on the processor 14 receives, parses and executes the query. Database systems in general, including the database server 14, stage data pages 24 from storage 20 into a shared buffer pool 26 in memory 18 in order to serve the query. Therefore, the database server 14 allocates memory space, referred to as page frames 28, to read in a number of data pages 24 from storage 20. This shared buffer pool 26 is a common space for data processing. In conventional database systems, the shared buffer pool would contain both clean data pages from storage 20 that are read-only, and dirty data pages 30 that are modified after a read that need to be written back to storage 20.

For best performance, the data pages in the shared buffer pool 26 are typically managed by a buffer replacement algorithm, such as least recently used (LRU) scheme in order to keep data most likely to be accessed in the future in the memory. In the meantime, the database server 14 writes back the dirty data pages 30 to storage 20 in the background to free up the buffer space for future data processing.

Regardless of buffer replacement algorithms, conventional database servers sometimes faces the situation where dirty data pages 30 need to be written back to storage 20 in order to allocate a free space in the shared buffer pool 26 when the system workload is high and the shared buffer pool 26 is full. As a result, a read operation may be blocked in some systems until a write operation completes even though the write and the read are independent each other. The exemplary embodiments refer to this issue as a "read blocked by write" problem. Note that this blocking of a read is different from the situation where a data read is blocked until preceding writes to the same data complete in order to preserve the "read after write" consistency semantics.

For example, when MySQL cannot find a page to process in a shared buffer pool, MySQL tries to secure a free page frame 28 before issuing the read request to storage. In general, a free page frame 28 can be found in the shared buffer pool if free page frames are collected in advance. However, when write backlogs are very high, no free page frame 28 can be found in the shared buffer pool. In this case, the database server traverses the LRU list of page frames 28, starting from the oldest page frame to search a victim page to write back to storage. This causes performance issues both in the host and storage because all buffer accesses are serialized on the traverse of LRU list to evict dirty data pages 30 and because write back to storage take a long time.

This symptom is common for conventional commercial database systems including Oracle as well as MySQL InnoDB. This serialization limits not only the parallelism in database servers but also the IO requests to storage. However, these performance issues are not noticeable if the storage comprises a typical hard disk drive (HDD) because I/O may already be saturated. In contrast, database servers with high performance storage such as SSD suffer from low utilization of host computing resources and storage bandwidth.

According to the exemplary embodiments, a hybrid buffer management scheme is proposed that address the serialization issue of LRU list traverse for the shared buffer pool 26 and the "read blocked by write" problem. The hybrid buffer management scheme may include an immutable buffer pool 34 in memory 18, a page multiplexer 36, and an immutable buffer manager 38 executing on a processor 16. Although not shown, the page multiplexer 36 may also execute on the processor 16.

Thus, a database hybrid buffer pool is provided comprising both the shared buffer pool 26 containing dirty data pages 30 that have been modified and will be written back to storage 20, as well as the immutable buffer pool 34 that temporarily contains read-only data pages 32 from storage 20, i.e., data pages accessed by a read-only query. For instance, data pages accessed by a select query without an update are read-only. The shared buffer pool 26 may store conventional long-lived shared data pages, while the immutable buffer pool may store short-lived read-only data pages 32, where a short-lived data page is valid only during the lifespan of a query.

The immutable buffer 34, which has minimal maintenance overhead, avoids unnecessary delay due to the eviction of dirty data pages 30 from the shared buffer pool 26. According to the exemplary embodiment, the immutable buffer 34 is a temporary buffer, assigned to a process, which is local, read-only, short-lived, lock-free, and recyclable. This special buffer can be used for data pages that satisfy certain conditions and can improve the overall system and storage utilization by avoiding unnecessary delay due to the eviction of dirty data pages 30, while prior long-lived shared buffers (or caches) experience contentions for free pages.

The page multiplexer 36 identifies which ones of the data pages 24 from storage 20 to store in the immutable buffer pool 34 based at least in part on information from the query processor 22. In one embodiment, the page multiplexer 36 receives information from the query processor 22 in the form of query hints 39. As described in FIG. 3, the query processor analyzes a given query and gives hints if it is a read query; if it can use an index; and/or if it accesses pages infrequently.

The hybrid buffer pool is provided for queries against read-only (immutable) pages 32 to avoid the "read blocked by write" problem and to avoid or minimize the issue of the serialization. The hybrid buffer pool has several advantages since it does not allow rarely accessed pages to enter the shared buffer pool 26. One advantage is that the database server 14 can issue more read requests to storage 20 since the read operations are not blocked by the write operations. This increases the utilization of the storage 20 and the database server 14, and consequently improves the throughput of the system and the response time of each query. Another advantage is that this hybrid buffer pool is also beneficial to other processes that need to read data pages into a buffer because programs are less-often contending for free pages. Yet a further advantage is that the hybrid buffer scheme can avoid the time consuming buffer management overhead for cold pages so that CPU time may be significantly saved.

Figure 2:
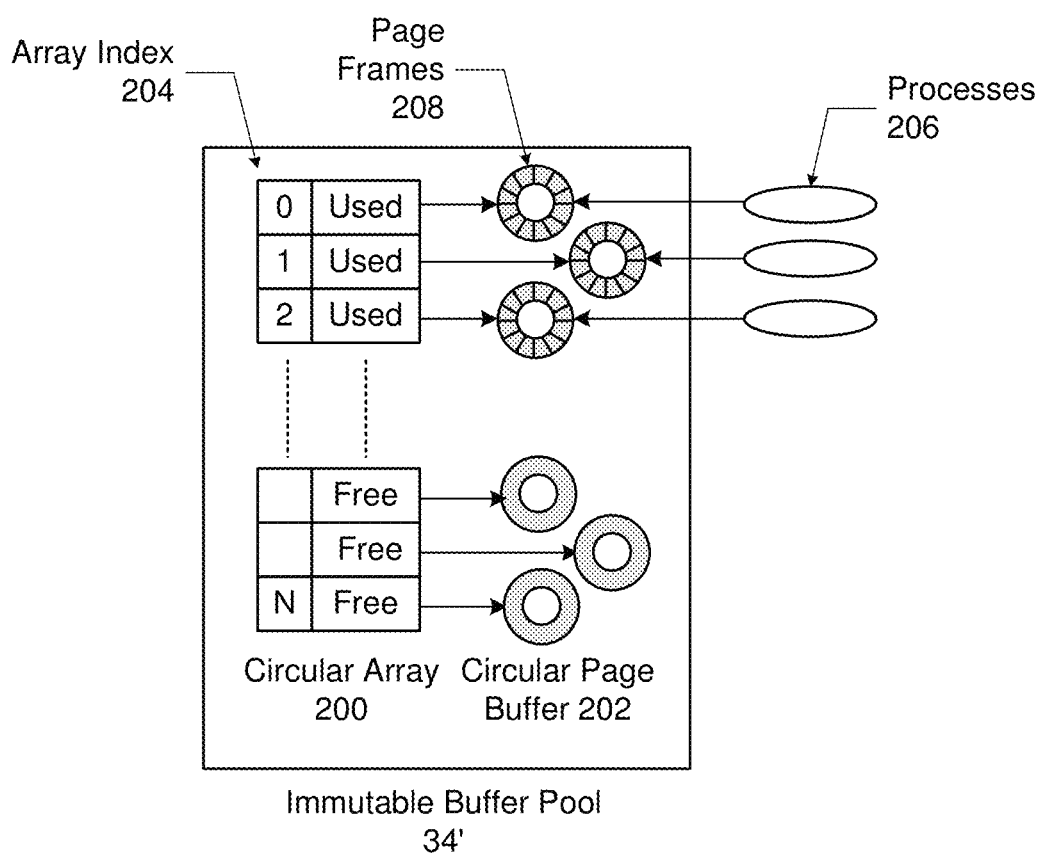
FIG. 2 is a block diagram illustrating components comprising an immutable buffer pool.

FIG. 2 is a block diagram illustrating components comprising an immutable buffer pool. According to one embodiment, the immutable buffer pool 34' can be implemented as a circular array 200 of fixed-sized circular page buffers 202, each comprising a plurality of page frames 208. In one embodiment, each of the circular page buffers 202 may be identified using an array index 204, where indices of the array index 204 may enumerate the circular page buffers 202. In one embodiment, the array index 204 (or another data structure) may include an indication of whether each of the circular page buffers 202 is used or free.

In one embodiment, the size of circular array 202 should be sufficiently large to support the number of concurrent processes 206 that the system supports. The size of circular page buffers 202 may be determined by factors including at least I/O bandwidth and the number of concurrent processes.

The immutable buffer pool 34 can be used to store or stage data pages 24 that satisfy predetermined conditions. Since the immutable buffer pool 34 is a one-time read-only memory space, the immutable buffer pool 34 can be recycled at any time after a query lifespan.

FIG. 3 is a table illustrating conditions that must be satisfied in order for the page multiplexer 36 to identify data pages 24 that can be stored in the immutable buffer pool 34. In one embodiment, the page multiplexer 36 may identify data pages that to be stored in the mutable buffer pool based at least in part on query hints 39 from the query processor. The page multiplexer 36 identifies and stores in the immutable buffer pool 34 any data pages 24 that satisfy the following conditions 300:

1) Any data page 24 in the long tail that has no spatial or temporal locality, which is infrequently accessed—pages that satisfy the conditions are typically accessed just once at a time and not accessed afterward for long time, and consequently cache is wasted;

2) Any data page 24 resulting from read queries with weak consistency. An example includes but is not limited to, a READ COMMITTED mode in ANSI isolation level where the query results can be different over time because the query is applied to a snapshot of table at a certain time.

3) Any data page that is accessed through a table index for a point or range query. Examples include, but are not limited to, leaf nodes of an Index Only Table of a storage engine (e.g., InnoDB for MySQL), and randomly accessed data pages of heap file of an Oracle database.

In one embodiment, the page multiplexer system does not cache internal index nodes of the index tree to the immutable buffer pool 34, but rather to the shared buffer pool 26 because internal index nodes have high temporal locality.

In one embodiment, the immutable buffer manager 38 is responsible for assigning circular page buffers 202 to requesting processes 206, which in one embodiment may also include threads. In one embodiment, the page multiplexer system may determine if data pages for the process are for the immutable buffer first, and then the immutable buffer manager assigns circular page buffers and page frames to requesting processes.

Figure 4A:
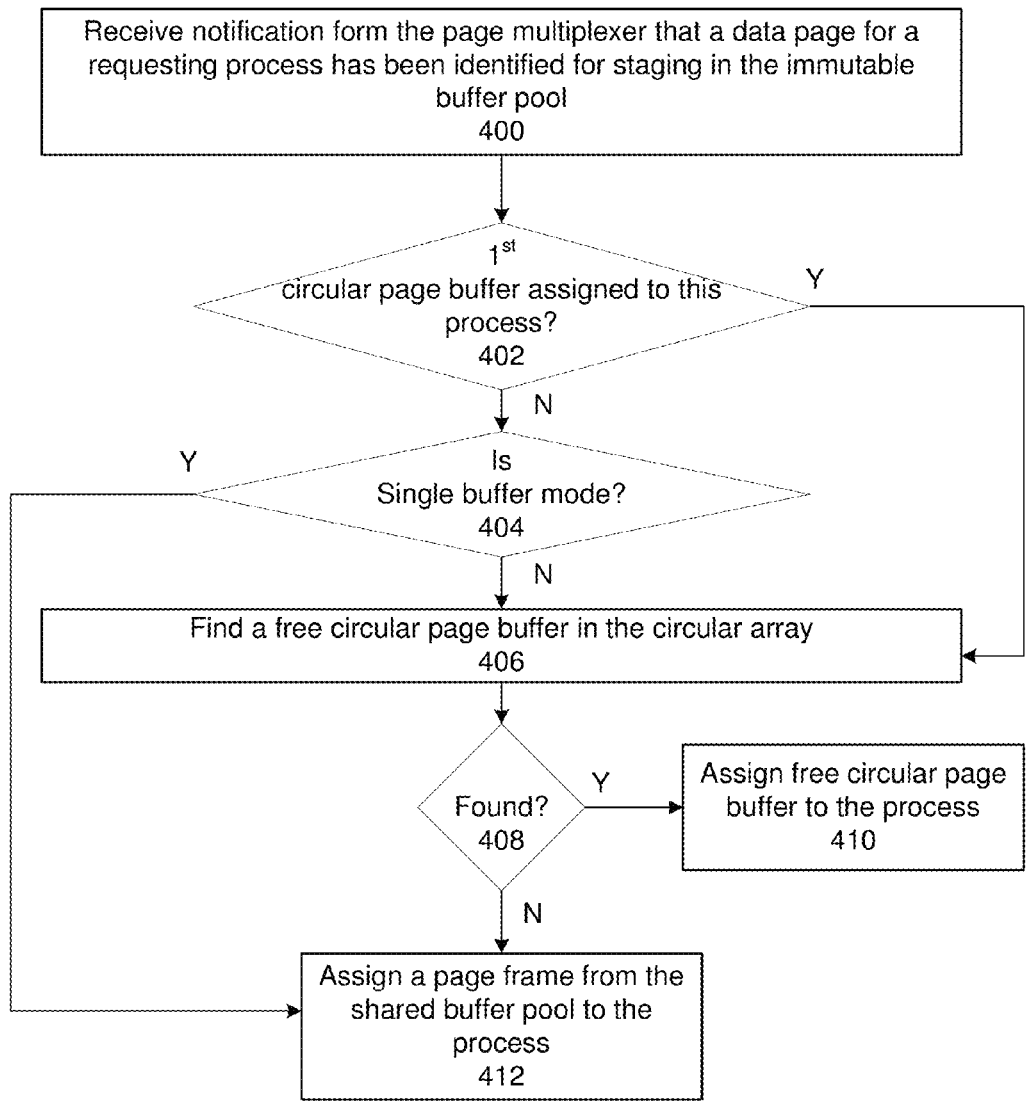
FIG. 4A is a flow diagram illustrating assignment of a circular page buffer to a process by the immutable buffer manager.

FIG. 4A is a flow diagram illustrating assignment of a circular page buffer to a process by the immutable buffer manager 38. The process may begin by the immutable buffer manager 38 receiving notification from the page multiplexer that a data page 24 for a requesting process 206 has been identified for staging in the immutable buffer pool 34' (block 400).

The immutable buffer manager 48 determines if this will be the first circular page buffer 202 assigned this process (block 402). If so, the immutable buffer manager 48 finds a free circular page buffer 202 in the circular array 200 (block 406). In one embodiment, the immutable buffer manager 48 finds a free circular page buffer 202 that is under an array lock to avoid a race condition in case of its multi-threaded implementation.

If this is not the first circular page buffer 202 assigned to this process 206 (block 402), then immutable buffer manager 48 determines if the process 206 is in single buffer mode (block 404). If the process 206 is in single buffer mode, then a page frame 28 from the shared buffer pool 26 is assigned to the process 206 (block 412).

If it is determined that this is the first circular page buffer 202 assigned the process (block 402) or that the process 206 is not in single buffer mode (block 404), then immutable page buffer 48 attempts to find a free circular page buffer 202 in the circular array 200 (block 406). If it is determined that a free circular page buffer 202 is available (block 408), then the immutable buffer manager 48 assigns the free circular page buffer 202 to the process (block 410). In one embodiment, assignment of the free circular page buffer 202 may further include assigning one of the indices of the array index 204 of a free circular page buffer 202 to the process 206.

If no free circular page buffer 202 is available, then the shared buffer pool 26 may be used and a page frame 28 from the shared buffer pool 26 is assigned to the process 206 (block 412).

In one embodiment, the immutable buffer manager may assign a page frame to the requesting process from the circular page buffer when the multiplexer requests a page frame for a data page.

Figure 4B:
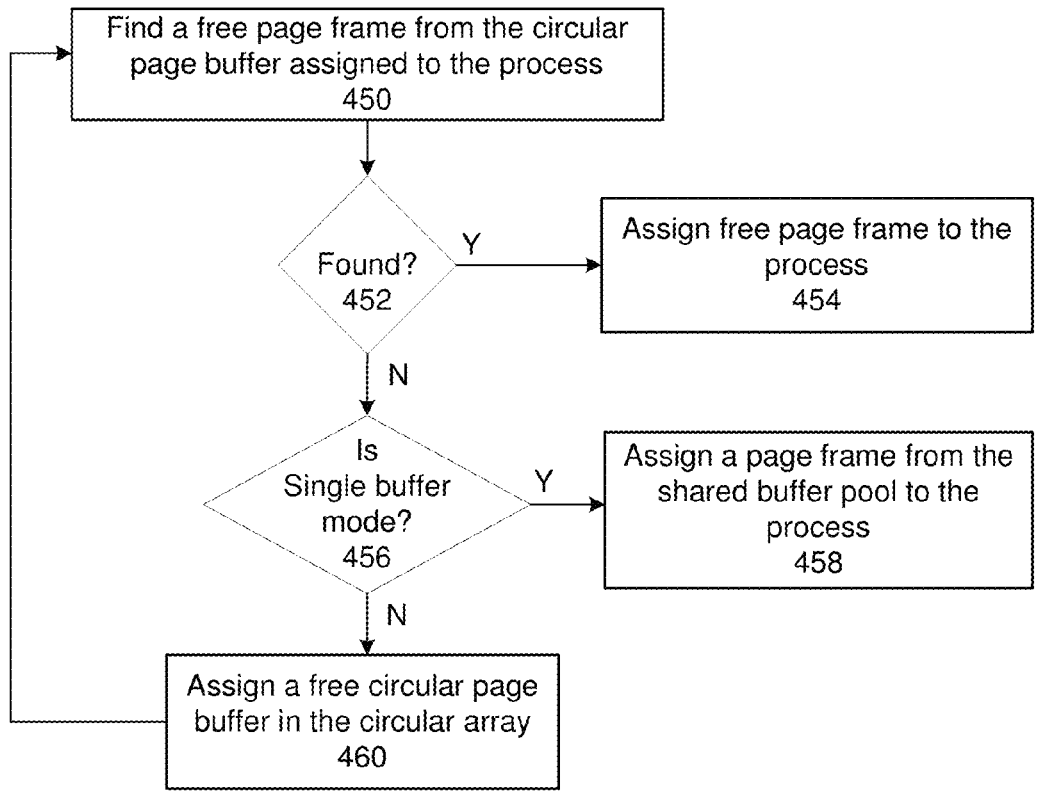
FIG. 4B is a flowchart illustrating allocation of an immutable buffer page frame to a process by the immutable buffer manager.

FIG. 4B is a flowchart illustrating allocation of a page frame from an assigned circular page buffer to a process by the immutable buffer manager 38. The process may begin by finding a free page frame 208 from the circular page buffer 202 assigned to the process 206 (block 450). If a free page frame 208 is found (block 452), then the free page frame is assigned to the process 206 (block 454). If a page frame 208 cannot be found (block 452), then it is determined if the process is in single buffer mode (block 456). If the process 206 is in single buffer mode, then a page frame 28 from the shared buffer pool 26 is assigned to the process 206 (block 458). If the process 206 is not in single buffer mode, then another circular page buffer 202 is assigned to the process 206 (block 460) and the process continues by finding a free page frame in the assigned circular page buffer (block 450). If the process cannot get another circular page buffer, it can retry until a timer expires or the number of retrials reaches a maximum.

Once a circular page buffer 202 is assigned to a process 206, the process 206 has an exclusive access to the circular page buffer 202. In one embodiment, a single circular page buffer 202 is assigned to a process 206 by default, but more than one circular page buffer 202 can be assigned to the process 206, depending on the system workload.

In one embodiment, the immutable buffer manager can implement a fair-sharing mechanism to prevent one process from using up the immutable buffer. For instance, if the process 206 waits on a page frame of a circular page buffer 206 for a predetermined amount of time because all page frames in a circular buffer are already assigned, the immutable buffer manager 38 can assign additional circular buffers 202. Consequently, other processes can have page frames assigned during the wait time period. In a light loaded condition, the process 206 obtains a sufficient number of circular page buffers 202 to avoid starvation for buffers.

Once any process 206 starts to use the shared buffer pool 26, the immutable buffer manager 38 may not assign more than one circular page buffer 202 to the processes 206 after that. If any process already has more than one assigned circular page buffer, the assigned circular page buffers 26 may remain assigned until the used circular page buffers are recycled. In this exemplary embodiment, serialization takes place only when an array index that assigns a circular buffer from the circular buffer array to a process is determined for a multi-threaded implementation, which is very short and negligible.

The present invention has been described in accordance with the embodiments shown, and there could be variations to the embodiments, and any variations would be within the spirit and scope of the present invention. For example, the exemplary embodiment can be implemented using hardware, software, a computer readable medium containing program instructions, or a combination thereof. Software written according to the present invention is to be either stored in some form of computer-readable medium such as a memory, a hard disk, or a CD/DVD-ROM and is to be executed by a processor. Accordingly, many modifications may be made by one of ordinary skill in the art without departing from the spirit and scope of the appended claims.

We claim:

1. A database query processing system, comprising:
    a hybrid buffer pool stored in a computer main memory coupled to a processor, the hybrid buffer pool comprising:
        a shared buffer pool of page frames that contain dirty data pages that are modified and will be written back to storage; and
        an immutable buffer pool that temporarily contains read-only data pages from the storage, wherein the shared buffer pool is different from the immutable buffer pool;
    a page multiplexer that identifies which ones of the data pages from storage to store in the immutable buffer pool based at least in part on information from a query processor; and
    an immutable buffer manager that assigns at least one of circular page buffers to a requesting process.

2. The database query processing system of claim 1, wherein the immutable buffer pool comprises a circular array of fixed-sized circular page buffers, each comprising a plurality of page frames.

3. The database query processing system of claim 2, wherein each of the circular page buffers is identified using an array index, where indices of the array index enumerate the circular page buffers.

4. The database query processing system of claim 3, wherein the array index includes an indication of whether each of the circular page buffers is used or free.

5. The database query processing system of claim 1, wherein assignment of the at least one circular page buffer comprises:
    responsive to determining that this is the first circular page buffer assigned to the process, assigning a free circular page buffer to the process; and responsive to determining that no free circular page buffer is available, assigning a page frame from the shared buffer pool to the process; and
    responsive to determining this is not the first circular page buffer assigned to the process, determining if the process is in single buffer mode, and if so, assigning a page frame from the shared buffer pool to the process.

6. The database query processing system of claim 1, further comprising allocation of at least one page frame from a circular page buffer assigned to the process by:
    responsive to finding a free page frame from the circular page buffer, assigning the free page frame to the process;
    responsive to not finding a free page frame, determining if the process is in single buffer mode, and if so, assigning a page frame from the shared buffer pool to the process; and
    responsive to determining that the process is not in single buffer mode, assigning another circular page buffer to the process.

7. The database query processing system of claim 1, wherein conditions that must be satisfied in order for the page multiplexer to identify the data pages for storage in the immutable buffer pool comprise:
    any data page in the long tail that has no spatial or temporal locality;
    any data page resulting from read queries with weak consistency; and
    any data page that is accessed through a table index for a point or range query.

8. The database query processing system of claim 1, wherein the immutable buffer pool is a one-time read-only memory space that is recycled at any time after a query lifespan.

9. The database query processing system of claim 1, wherein the shared buffer pool stores long-lived shared data pages, and the immutable buffer pool stores short-lived read-only data pages that avoids delay due to eviction of dirty data pages from the shared buffer pool.

10. The database query processing system of claim 1, wherein the page multiplexer receives information from the query processor in the form of query hints.

11. A database server having access to a storage of data pages, comprising:
    a processor;
    a main memory coupled to the processor, the main memory including a hybrid buffer pool, comprising:
        a shared buffer pool of page frames that contains dirty data pages that are modified and will be written back to storage; and
        an immutable buffer pool that temporarily contains read-only data pages from the storage, wherein the shared buffer pool is different from the immutable buffer pool;
    a page multiplexer executed by the processor that identifies which ones of the data pages from storage to store in the immutable buffer pool based at least in part on information from a query processor; and
    an immutable buffer manager executed by the processor that assigns at least one of circular page buffers to a requesting process.

12. The database server of claim 10, wherein the immutable buffer pool comprises a circular array of fixed-sized circular page buffers, each comprising a plurality of page frames.

13. The database server of claim 12, wherein each of the circular page buffers is identified using an array index, where indices of the array index enumerate the circular page buffers.

14. The database server of claim 13, wherein the array index includes an indication of whether each of the circular page buffers is used or free.

15. The database server of claim 11, wherein assignment of the at least one circular page buffer comprises:
    responsive to determining that this is the first circular page buffer assigned to the process, assigning a free circular page buffer to the process; and responsive to determining that no free circular page buffer is available, assigning a page frame from the shared buffer pool to the process; and responsive to determining this is not the first circular page buffer assigned to the process, determining if the process is in single buffer mode, and if so, assigning a page frame from the shared buffer pool to the process.

16. The database server of claim 11, further comprising allocation of at least one page frame from a circular page buffer assigned to the process by:
responsive to finding a free page frame from the circular page buffer, assigning the free page frame to the process;
responsive to not finding a free page frame, determining if the process is in single buffer mode, and if so, assigning a page frame from the shared buffer pool to the process; and
responsive to determining that the process is not in single buffer mode, assigning another circular page buffer to the process.

17. The database server of claim 11, wherein conditions that must be satisfied in order for the page multiplexer to identify the data pages for storage in the immutable buffer pool comprise:
any data page in the long tail that has no spatial or temporal locality;
any data page resulting from read queries with weak consistency; and
any data page that is accessed through a table index for a point or range query.

18. The database server of claim 11, wherein the immutable buffer pool is a one-time read-only memory space that is recycled at any time after a query lifespan.

19. The database server of claim 11, wherein the shared buffer pool stores long-lived shared data pages, and the immutable buffer pool stores short-lived read-only data pages that avoids delay due to eviction of dirty data pages from the shared buffer pool.

20. The database server of claim 11, wherein the page multiplexer receives information from the query processor in the form of query hints.

* * * * *